(12) United States Patent
Lee

(10) Patent No.: US 9,036,399 B2
(45) Date of Patent: May 19, 2015

(54) VARIABLE RESISTANCE MEMORY DEVICE

(71) Applicant: SK hynix Inc., Incheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 13/842,362

(22) Filed: Mar. 15, 2013

(65) Prior Publication Data

US 2014/0183440 A1    Jul. 3, 2014

(30) Foreign Application Priority Data

Dec. 28, 2012  (KR) .......................... 10-2012-0157395

(51) Int. Cl.
  G11C 11/00   (2006.01)
  H01L 27/24   (2006.01)
  H01L 27/22   (2006.01)
  H01L 45/00   (2006.01)

(52) U.S. Cl.
  CPC ............. *H01L 27/2463* (2013.01); *H01L 45/06* (2013.01); *H01L 45/08* (2013.01); *H01L 45/1233* (2013.01); *H01L 45/144* (2013.01); *H01L 45/146* (2013.01); *H01L 45/147* (2013.01); *H01L 27/224* (2013.01); *H01L 27/228* (2013.01); *H01L 27/2409* (2013.01); *H01L 27/2436* (2013.01); *H01L 27/2481* (2013.01)

(58) Field of Classification Search
  CPC ........... G11C 11/4094; G11C 11/4097; G11C 13/002; G11C 2213/72; H01L 45/04
  USPC .................................. 257/2, 5; 365/148, 222
  See application file for complete search history.

(56) References Cited

U.S. PATENT DOCUMENTS

| 5,267,215 | A   |   | 11/1993 | Tsujimoto |        |
|-----------|-----|---|---------|-----------|--------|
| 7,317,649 | B2  |   | 1/2008  | Kajigaya  |        |
| 7,471,558 | B2  | * | 12/2008 | Kajigaya  | 365/174 |
| 8,467,229 | B2  | * | 6/2013  | Ikeda et al. | 365/148 |
| 2011/0044090 | A1 | * | 2/2011 | Terada et al. | 365/148 |

FOREIGN PATENT DOCUMENTS

KR    10-1999-1000001    1/1999

OTHER PUBLICATIONS

Akifumi Kawahara et al., "An 8Mb Multi-Layered Cross-Point ReRAM Macro with 443MB/s Write Throughput", in Proc. of ISSCC, 2012.

* cited by examiner

*Primary Examiner* — David Vu
*Assistant Examiner* — Brandon Fox

(57) ABSTRACT

A variable resistance memory device includes a plurality of cell blocks each of which includes a plurality of first lines extending in parallel to each other along a first direction, a plurality of second lines extending in parallel to each other along a second direction crossing the first direction, and a plurality of memory cells including variable resistance layers arranged at intersections of the plurality of first lines and the plurality of second lines and a plurality of selection units coupled to the plurality of first lines and coupling two neighboring cell blocks.

13 Claims, 16 Drawing Sheets

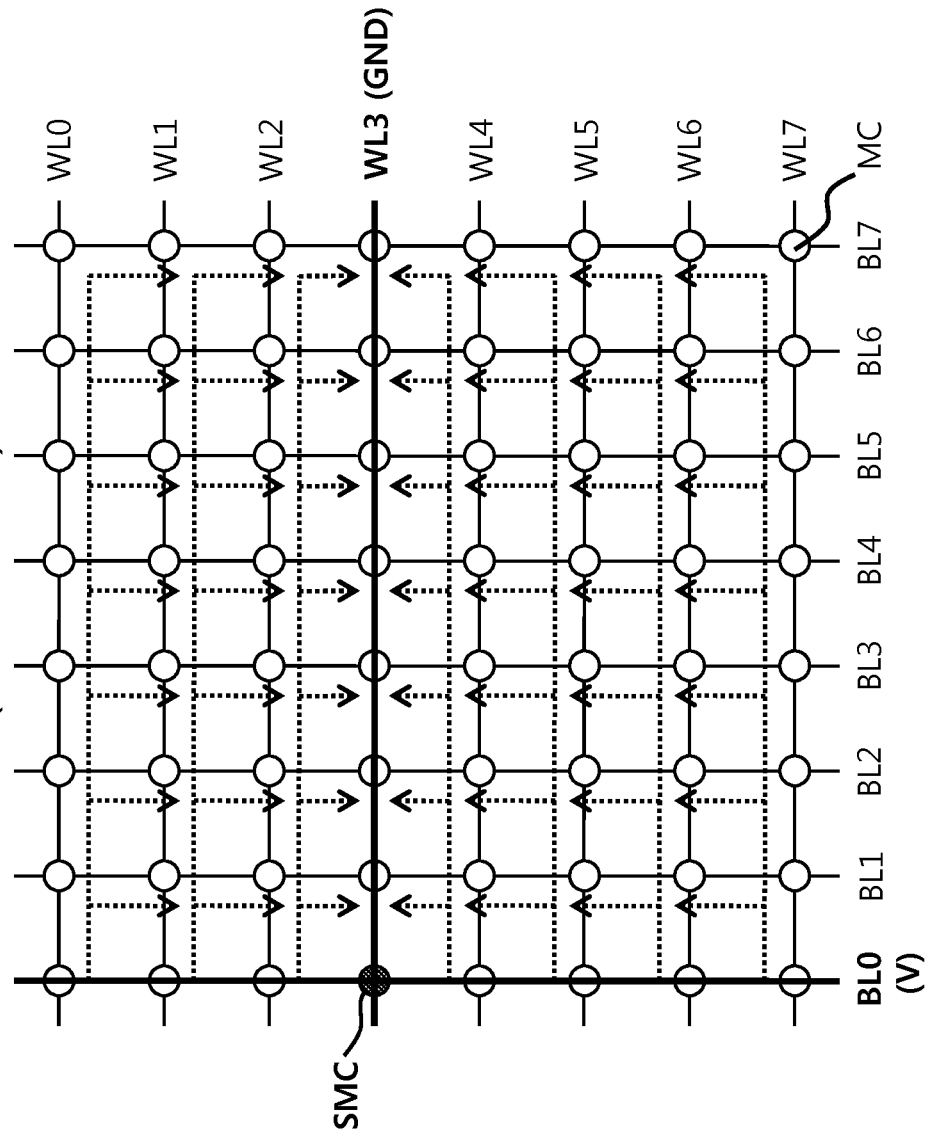

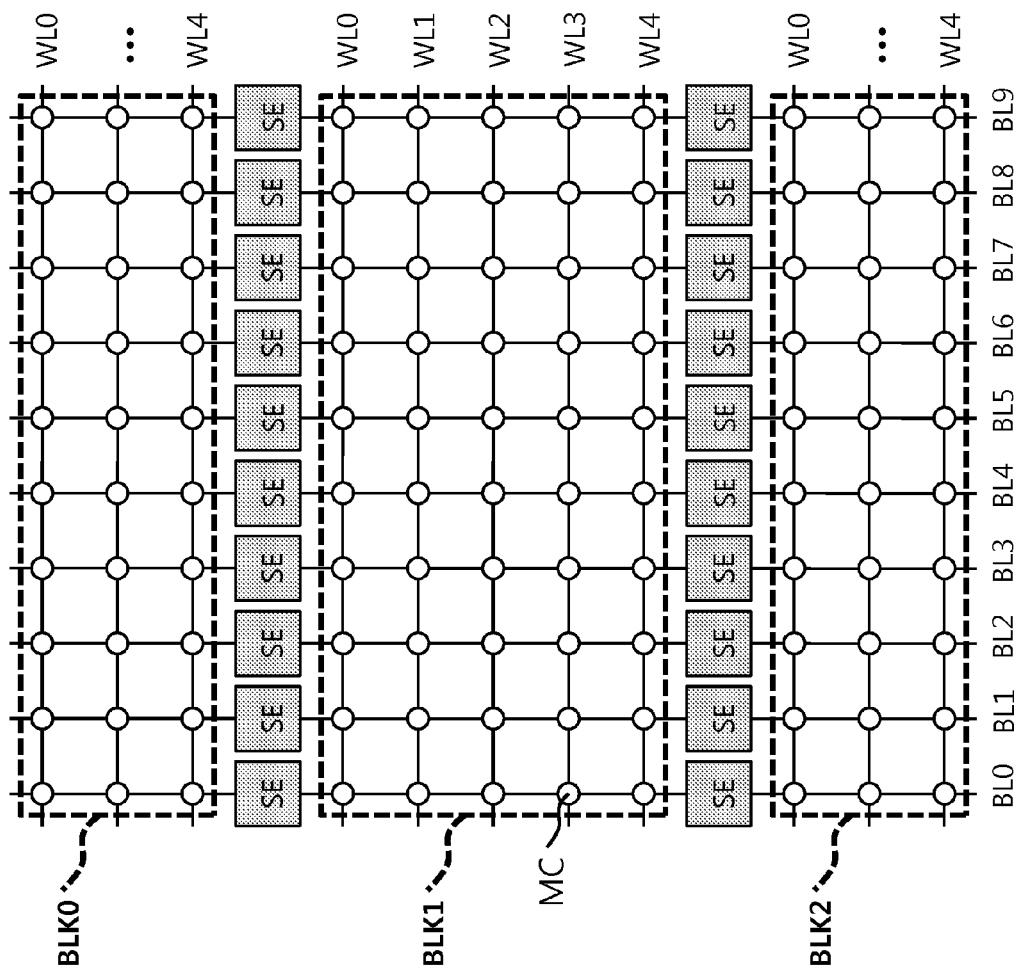

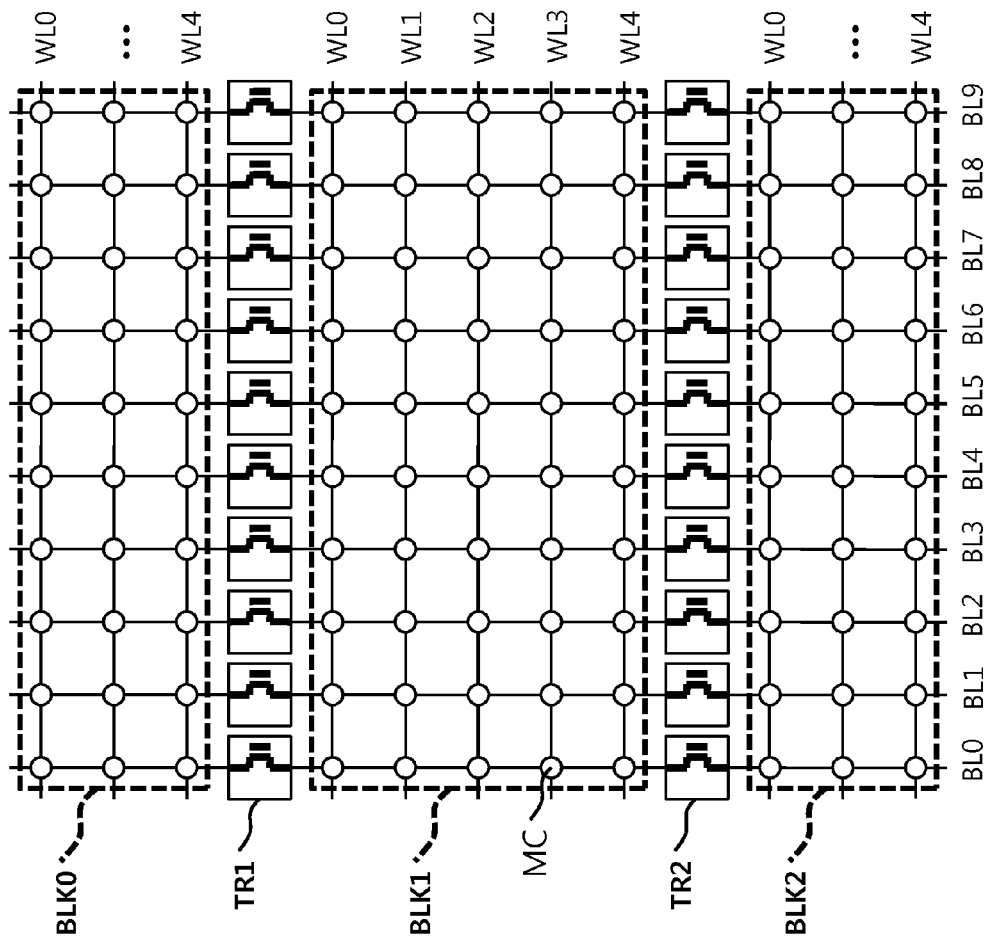

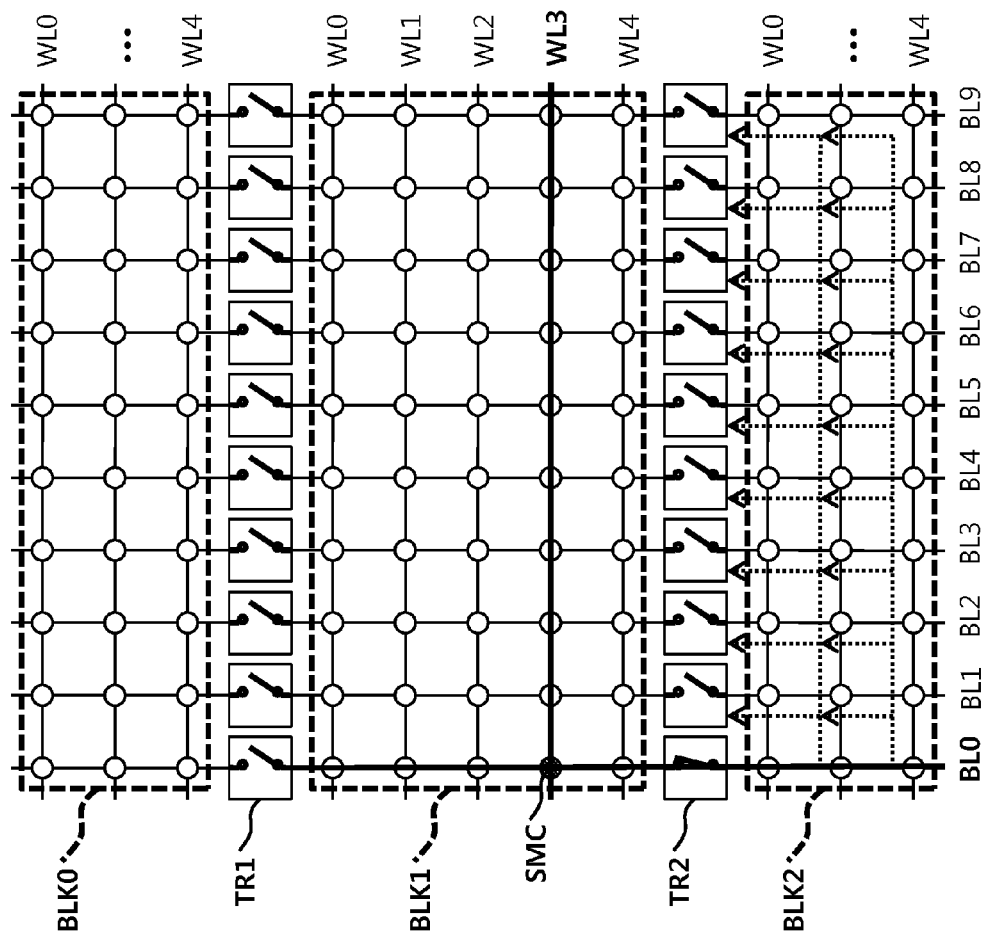

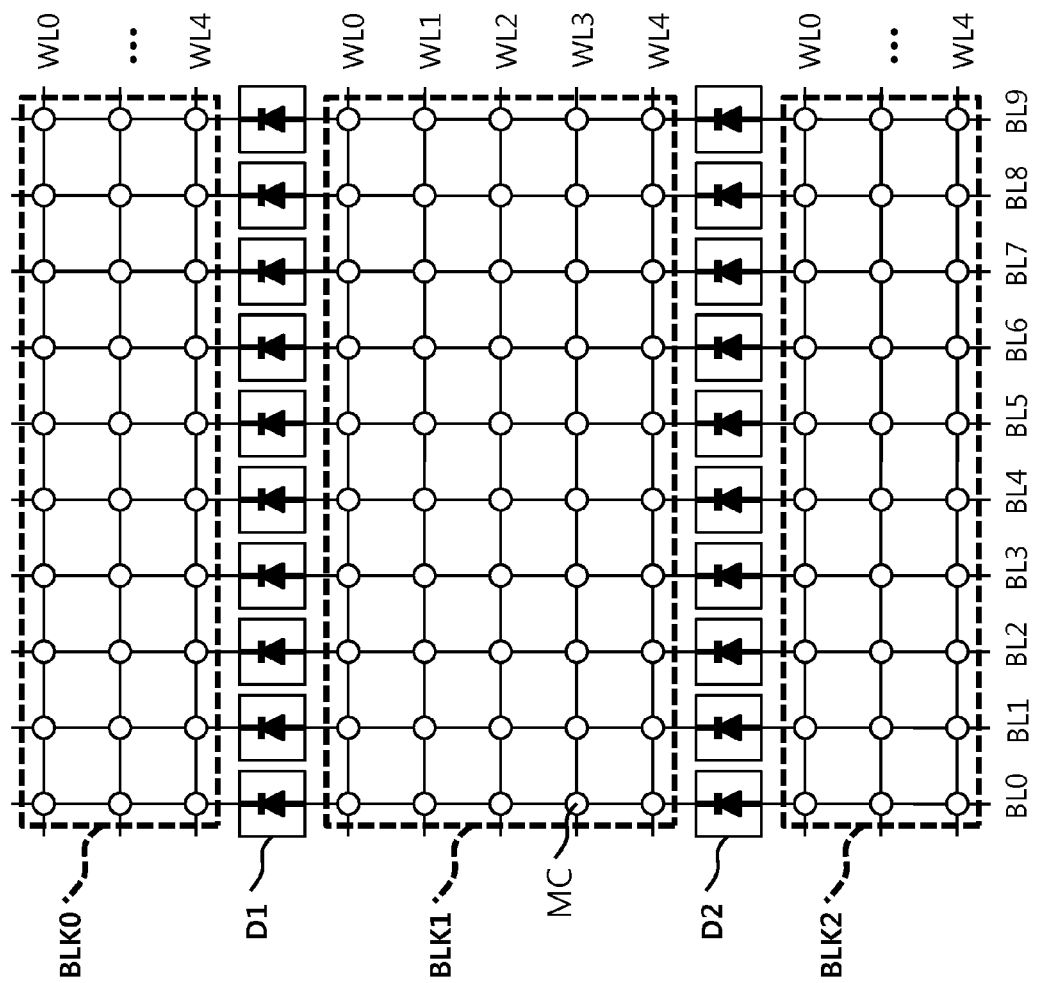

VARIABLE RESISTANCE MEMORY DEVICE

CROSS-REFERENCE TO RELATED APPLICATIONS

The present application claims priority of Korean Patent Application No. 10-2012-0157395, filed on Dec. 28, 2012, which is incorporated herein by reference in its entirety.

BACKGROUND

1. Field

Exemplary embodiments of the present invention relate to a variable resistance memory device and a method for operating the same, and more particularly, to a variable resistance memory device having a cross point cell array configuration and a method for operating the same.

2. Description of the Related Art

A variable resistance memory device (or a resistance variable memory device) changes its resistance value between at least two resistance states depending on an external input. The variable resistance memory device stores data using such a resistance changing property and includes a Resistive Random Access Memory (ReRAM) device, a Phase Change RAM (PCRAM) device, a Spin Transfer Torque-RAM (STT-RAM) device, etc. Many studies have been done on various variable resistance memory devices since they have a simple structure and good non-volatile properties.

Among them, a ReRAM device may include upper and lower electrodes and a variable resistance layer that is disposed between the upper and lower electrodes and formed of, for example, a Perovskite-based material or transitional metal oxide. In the ReRAM device, a filament as a current path is created in or removed from the variable resistance layer depending on a level of a voltage applied to the upper and lower electrodes.

When the filament is created, the variable resistance layer is at a low resistance state. In contrast, when no filament is present, the variable resistance layer is at a high resistance state. Switching from the high resistance state to the low resistance state is called a 'set' operation, and switching from the low resistance state to the high resistance state is called a 'reset' operation.

FIGS. 1A to 1C are plane views illustrating a conventional variable resistance memory device.

Referring to FIG. 1A, the variable resistance memory device has a cross point cell array configuration where memory cells MCs are arranged at cross points where a plurality of bit lines BL0~BL7 extending in parallel to each other intersects with a plurality of word lines WL0~WL7 extending in parallel to each other.

Data stored in a given memory cell, e.g., the selected memory cell SMC of FIG. 1A, is read out by applying a ground voltage GND to a selected word line, e.g., WL3, applying a given voltage V to a selected bit line, e.g., BL0, and detecting a current flowing through memory cell SMC. The current flowing through memory cell SMC varies depending on a resistance state of memory cell SMC.

In the cross point cell array configuration, a voltage having a certain level, which is less than that of the given voltage V applied to the selected memory cell SMC, may be applied to unselected memory cells. As a result, a current may leak through the unselected memory cells as indicated by dotted arrow lines in FIG. 1A.

Referring to FIG. 1B, the variable resistance memory cell device includes a plurality of memory cell arrays MCA0~MCA3, each including memory cells arranged in a matrix pattern. In a peripheral region of each of the memory cell arrays MCA0~MCA3, a plurality of core circuits CC necessary for an operation of the variable resistance memory device may be provided.

As a size of each of the memory cell arrays MCA0~MCA3 increases, the leakage current increases as well, degrading reliability of the variable resistance memory device. In addition, the greater the memory cell array size, the greater an area occupied by the core circuits. Thus, the increase of the memory cell array size may be limited. As a result, it is difficult to increase a degree of integration of the memory device.

Referring to FIG. 1C, a hierarchical bit line structure, which includes global bit lines GBL0~GBL2 and a plurality of local bit lines BL0~BL5, was suggested to suppress the leakage current generated in the cross point cell array configuration. (see A. Kawahara et al., "*An 8 Mb Multi-Layered Cross-Point ReRAM Macro with 443 MB/s Write Throughput,*" in Proc. of ISSCC, 2012)

However, in the hierarchical bit line structure shown in FIG. 1C, additional transistors such as transistor TR are required for selecting the local bit lines BL0~BL5 and a plurality of selection lines SL0~SL3 to couple the local bit lines BL0~BL5 to the global bit lines GBL0~GBL2. In addition, the memory cell arrays formed using multiple layers occupy a large area, and thus a degree of memory cell integration may decrease.

SUMMARY

Various embodiments are directed to a variable resistance memory device including a selection unit, such as a transistor or a diode, between two neighboring cell blocks of a cross point cell array to reduce a leakage current, and a method for operating the same.

In accordance with an embodiment of the present invention, a variable resistance memory device includes a plurality of memory cells comprising a plurality of first lines extending in parallel to each other and extending along a first direction, a plurality of second lines extending in parallel to each other and extending along a second direction crossing the first direction, and resistance variable layers arranged at intersections of the plurality of first lines and the plurality of second lines, a plurality of cell blocks including the plurality of memory cells, and a plurality of selection units coupled to the plurality of first lines and coupling neighboring cell blocks to each other.

In accordance with another embodiment of the present invention, a variable resistance memory device includes a stack structure comprising a plurality of first lines extending in parallel to each other and extending along a first direction, and a plurality of second lines extending in parallel to each other and extending along a second direction across the first direction, wherein the plurality of first lines and the plurality of second lines are stacked in an alternative manner, a plurality of memory cells including resistance variable layers which are arranged at intersections of the plurality of first lines and the plurality of second lines, a plurality of cell blocks including the plurality of memory cells located at the same level, and a plurality of selection units coupled to the plurality of second lines and coupling neighboring cell blocks at the same level to each other.

In accordance with still another embodiment of the present invention, a variable resistance memory device includes a plurality of cell blocks including resistance variable layers which are arranged at intersections of a plurality of first lines and a plurality of second lines, wherein the plurality of first lines and the plurality of second lines extend across each other, and block selection units provided between two neighboring cell blocks.

According to the present invention, a selection unit, such as a transistor and a diode, is provided between two neighboring cell blocks in a cross point cell array to effectively prevent leakage currents.

BRIEF DESCRIPTION OF THE DRAWINGS

FIGS. 1A to 1C are plan views illustrating a conventional variable resistance memory device.

FIGS. 2A to 2F are plan views illustrating a variable resistance memory device and an operation of the variable resistance memory device according to an embodiment of the present invention.

DETAILED DESCRIPTION

Figure 1B:
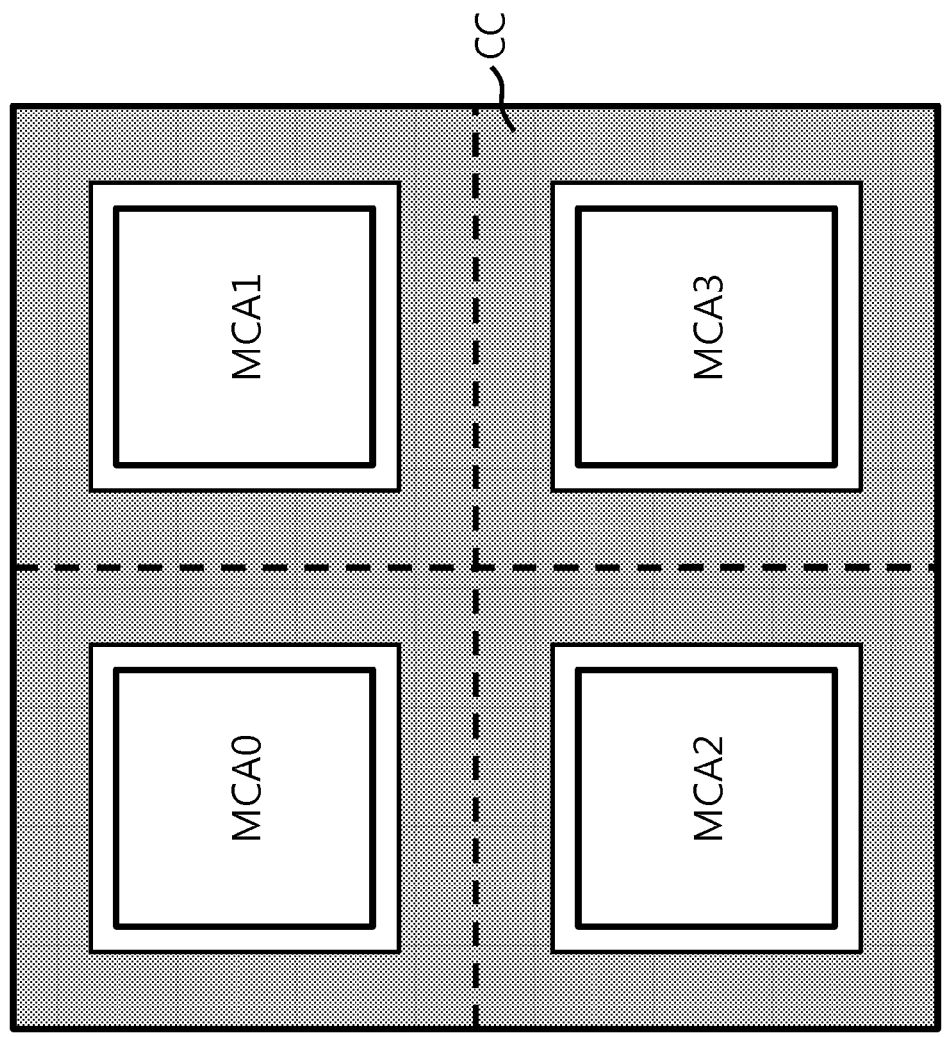
Figure 1C:
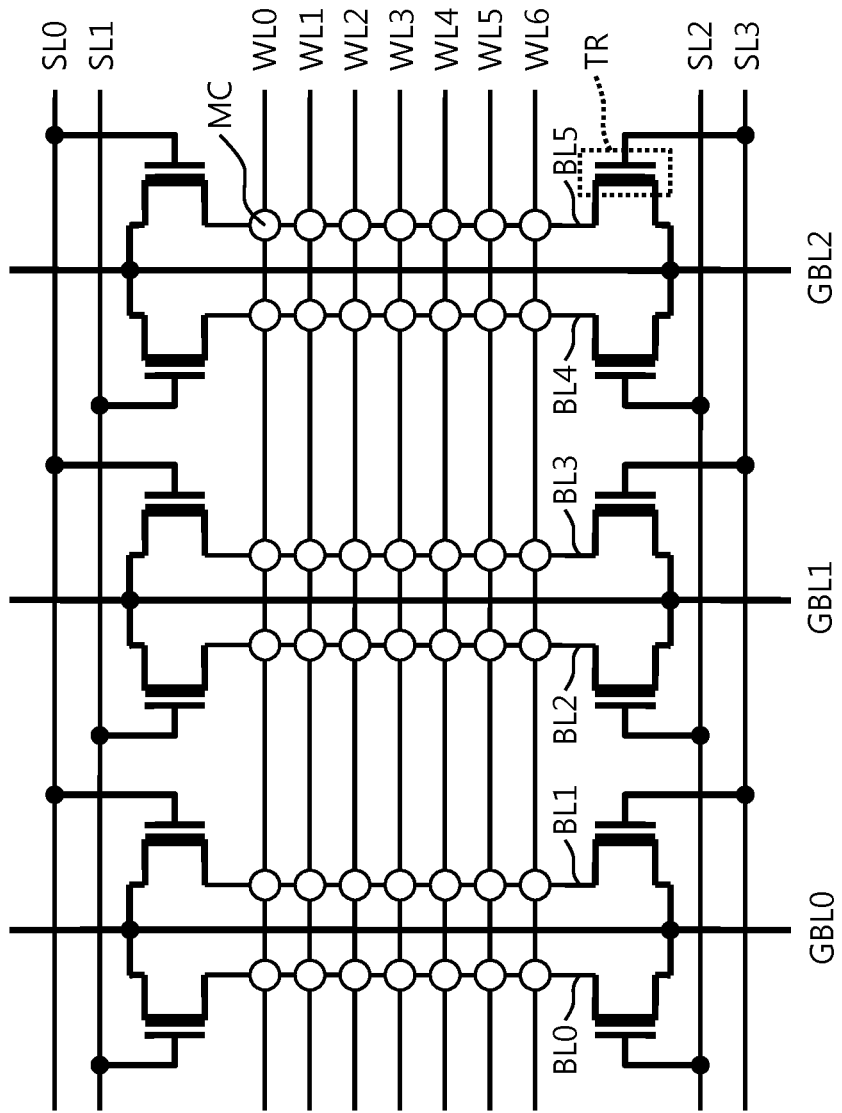

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2F are plan views illustrating a variable resistance memory device and an operation of the variable resistance memory device according to an embodiment of the present invention.

Referring to FIG. 2A, the variable resistance memory device includes a plurality of cell blocks BLK0~BLK2. Each of the cell blocks BLK0~BLK2 includes a plurality of memory cells MCs, a plurality of bit lines BL0~BL9 extending in parallel to each other, and a plurality of word lines WL0~WL4 extending in parallel to each other, the plurality of word lines WL0~WL4 extending across the plurality of bit lines BL0~BL9.

The bit lines BL0~BL9 and the word lines WL0~WL4 are formed of layers disposed at different levels of height over a substrate, so that the bit lines and the word lines are separate from each other and are not electrically shorted.

The bit lines BL0~BL9 and word lines WL0~WL4 each may be formed of metal nitride such as titanium nitride (TiN), Tantalum nitride (TaN), or tungsten nitride (WN), metal such as tungsten (W), aluminum (Al), copper (Cu), gold (Au), silver (Ag), platinum (Pt), nickel (Ni), Chromium (Cr), cobalt (Co), Titanium (Ti), ruthenium (Ru), hafnium (Hf), or zirconium (Zr), or doped silicon.

The memory cells MCs may be provided in a matrix pattern at intersectional points of the bit lines BL0~BL9 and the word lines WL0~WL4. An end of each memory cell MC is coupled to one of the plurality of bit lines BL0~BL9, and the other end of the memory cell is coupled to one of the plurality of the word lines WL0~WL4.

Each memory cell MC includes a variable resistance layer and upper and lower electrodes disposed over and below the variable resistance layer, respectively. A resistance value of the variable resistance layer varies depending on a voltage or a current applied thereto. Thus, the variable resistance layer can switch between at least two different resistance states.

The variable resistance layer may have a structure where an electrical resistance value varies according to a change in oxygen vacancy or ion migration, a structure where an electrical resistance value varies by a phase change of a material, or a magnetic tunnel junction (MTJ) structure where an electrical resistance value varies by a magnetic field or a spin transfer torque (STT).

The structure where an electrical resistance value varies according to a change in oxygen vacancy or ion migration may include a Perovskite-based material such as STO(SrTiO$_3$), BTO(BaTiO$_3$), PCMO(Pr$_{1-x}$Ca$_x$MnO$_3$), etc., or an oxide material including Transition Metal Oxide (TMO) such as TiO$_2$, HfO$_2$, ZrO$_2$, Al$_2$O$_3$, Ta$_2$O$_5$, Niobium oxide (Nb$_2$O$_5$), CO$_3$O$_4$, NiO, WO$_3$, lanthanum oxide (La$_2$O$_3$), etc.

The structure where an electrical resistance value varies by a phase change of a material may include a material such as chalcogenide material, which is interchangeable between a crystalline state and an amorphous state. For example, the chalcogenide material includes GST(GeSbTe) that is obtained by combining germanium, antimony, and tellurium with a given ratio.

The magnetic tunnel junction (MTJ) structure may include a free magnetic layer, a pinned magnetic layer, and a barrier layer interposed between the free and pinned magnetic layers. The free magnetic layer and the pinned magnetic layer each may include a ferromagnetic material such as iron (Fe), nickel (Ni), cobalt (Co), gadolinium (Gd), Dysprosium (Dy), or a combination thereof. The barrier layer may include any of magnesium oxide (MgO), aluminum oxide (Al$_2$O$_3$), hafnium oxide (HfO$_2$), zirconium oxide (ZrO$_2$), silicon oxide (SiO$_2$), etc.

A plurality of selection units SEs coupled to the bit lines BL0~BL9 is provided between two neighboring cell blocks, e.g., BLK0 and BLK1, or BLK1 and BLK2, of the cell blocks BLK0~BLK2 to couple the two neighboring cell blocks to each other. In FIG. 2A, each cell block includes 10 bit lines BL0~BL9, 5 word lines WL0~WL4, and 50 memory cells located at intersections of the bit lines BL0~BL9 and the word lines WL0~WL4, but embodiments of the present invention are not limited thereto. In other embodiments, each cell block may include more or less than 50 memory cells.

Figure 2B:
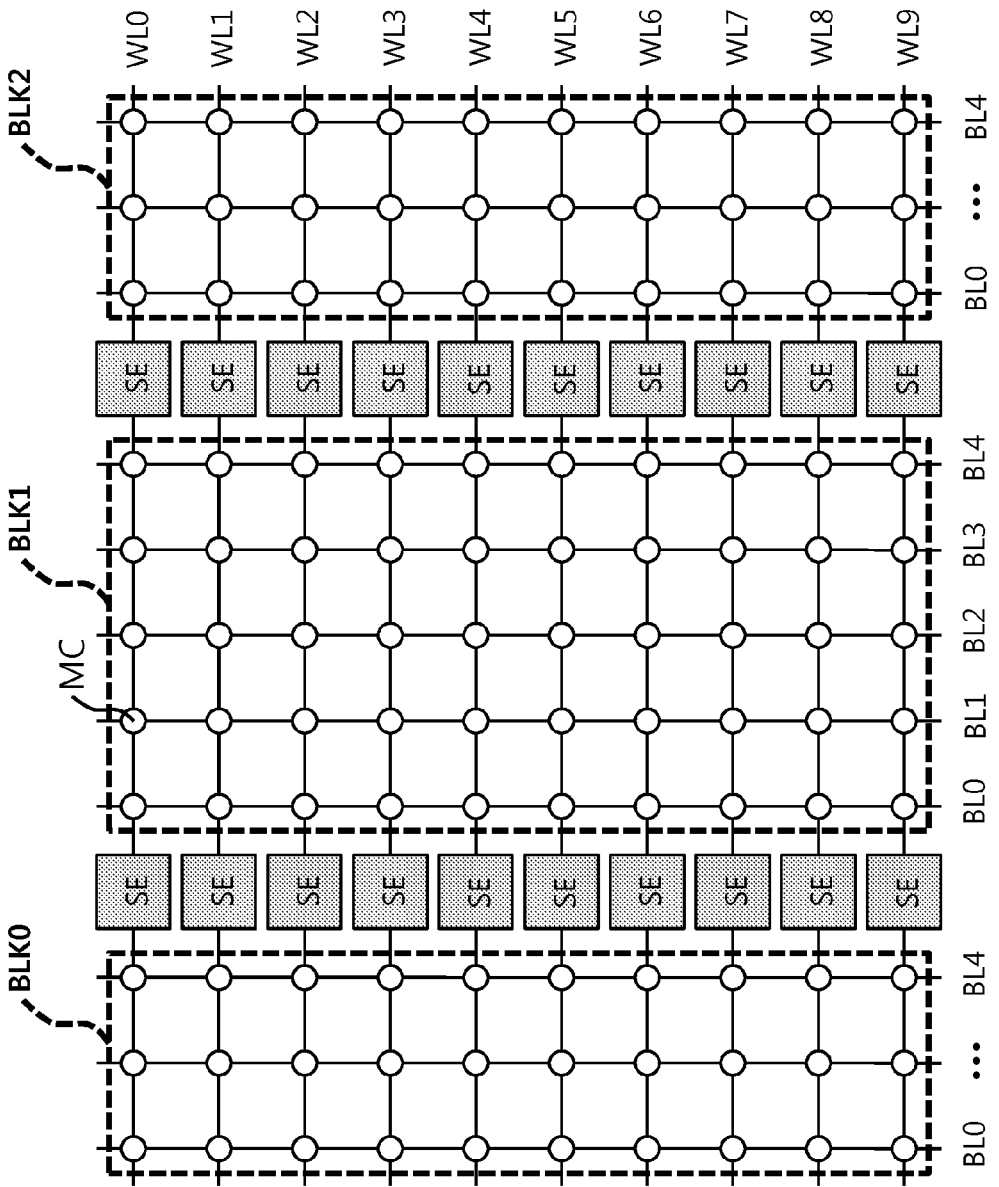

Referring to FIG. 2B, each selection unit SE may be provided between two neighboring cell blocks, e.g., BLK0 and BLK1, or BLK1 and BLK2, and be coupled to each of word lines WL0~WL9 rather than each of bit lines BL0~BL4. That is, as shown in FIGS. 2A and 2B, the selection units SEs may be inserted in the cell array either along a vertical direction or along a horizontal direction.

In FIGS. 2A and 2B, 2 lines of selection units SEs are shown, but embodiments of the present invention are not limited thereto. For example, in other embodiments, the cell array may include more than 2 lines of selection units SEs. In accordance with another embodiment, the selection units SEs in each line may not be arranged along a straight line. In another embodiment, the selection units SEs may be arranged at a bottom of each cell block BLK0~BLK2.

Referring to FIG. 2C, the selection units SEs provided between the cell blocks BLK0~BLK2 may include transistors TR1 and TR2. Each of the transistors TR1 and TR2 serves as an ON/OFF switch and may include an N-channel Metal Oxide Semiconductor (NMOS) or P-channel Metal Oxide Semiconductor (PMOS) transistor. A gate electrode of the transistor TR1 or TR2 may be formed in any of various structures including a stack structure, a buried structure, and a vertical structure.

Referring to FIG. 2D, the first and second transistors TR1 and TR2 can effectively prevent a leakage current from flowing from a cell block not including a selected memory cell (hereinafter, referred to as 'a unselected cell block') to a cell block including the selected memory cell (hereinafter, referred to as 'a selected cell block').

For example, when a ground voltage is applied to a selected word line WL3 and a given voltage rather than the ground voltage is applied to a selected bit line BL0 so that a current flows from the selected bit line BL0 to the selected word line WL3, the second transistor TR2 coupled to the selected bit line BL0 is turned on so that the current can flow to a selected memory cell SMC in the cell block BLK1. Transistors other than the transistors necessary to provide current to the selected memory cell SMC are turned off, thereby preventing leakage current from flowing from the unselected cell blocks BLK0 and BLK2 to the selected cell block BLK1. In FIG. 2D, transistors that are turned off include the first transistor TR1 coupled to the selected bit line BL0 and the transistors TR1 and TR2 coupled to the unselected bit lines BL1~BL9.

Specifically, the first transistor TR1 coupled to the selected bit line BL0 cuts off a current flow from the unselected cell blocks BLK0, and the second transistors TR2 coupled to the unselected bit lines BL1~BL9 cut off current flows (indicated by dotted arrows) from the unselected memory cells MCs in the unselected cell block BLK2.

The entire memory cell array may be divided into multiple cell blocks, and a leakage current in the selected cell block BLK1 may be controlled below a predetermined level so that the leakage current does not affect an operation of the variable resistance memory device.

Referring to FIG. 2E, the selection units SEs provided between the cell blocks BLK0~BLK2 may include diodes D1 and D2.

Each of the diodes D1 and D2 is designed to flow a current in a unilateral direction, and may include a Schottkey diode, a PN diode, a PIN diode, or a MIM diode. Alternatively or in combination, the selection unit SE may include an asymmetric tunnel barrier unit having a non-linear current-voltage characteristic, a metal-insulator transition unit interchangeable between a metal and an insulator by being transitioned to a crystalline state at a given critical temperature, an Ovonic switching unit performing a switching operation at a given threshold voltage, etc.

Figure 2F:
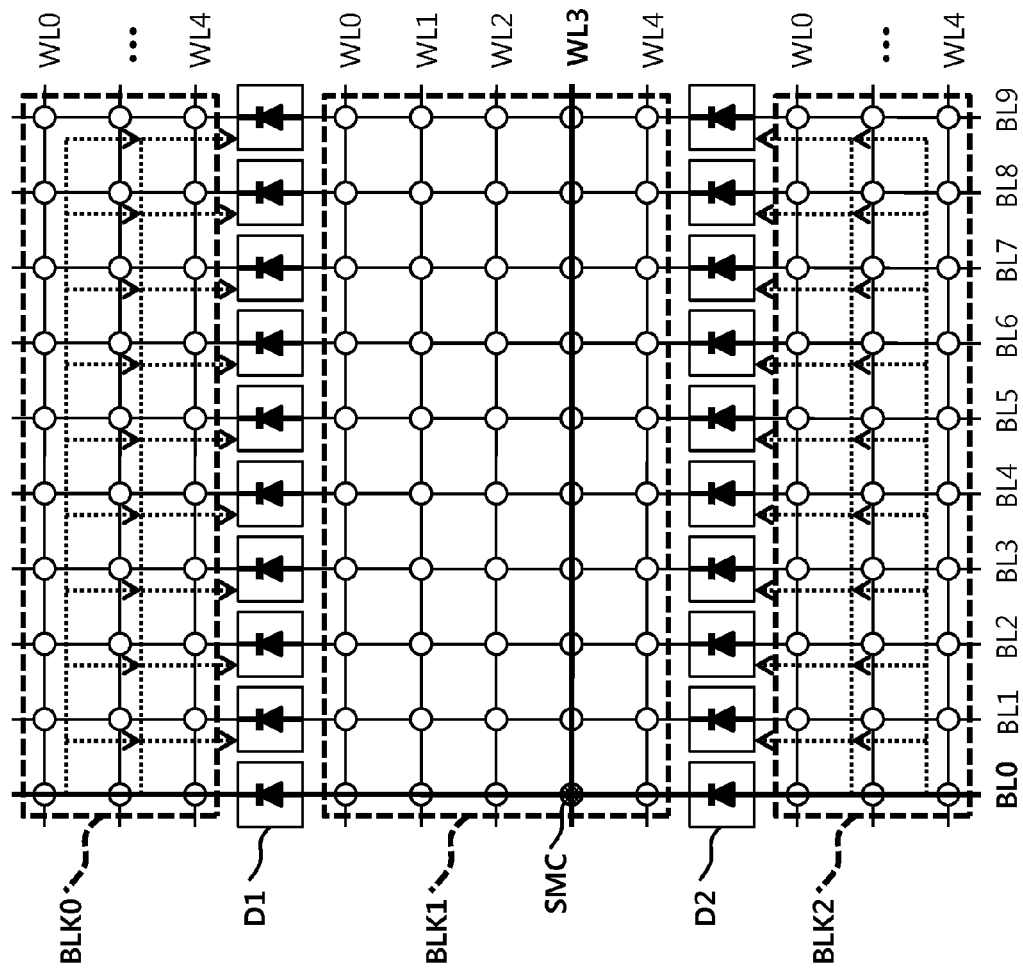

Referring to FIG. 2F, a leakage current from the unselected cell block BLK0 or BLK2 to the selected cell block BLK1 may be effectively prevented by the first or second diode D1 or D2.

For example, when a ground voltage is applied to the selected word line WL3 and a given voltage rather than the ground voltage is applied to the selected bit line BL0 so that a current flows from the selected bit line BL0 to the selected word line WL3, the diodes D1 and D2 flow a current unidirectionally from an anode to a cathode, and thus a leakage current (indicated by the dotted arrows shown in an upper portion of FIG. 2F) flowing through unselected memory cells MCs in the unselected cell block BLK0 is prevented from flowing to the selected cell block BLK1 by the first diode D1 coupled to unselected bit lines BL1~BL9.

In a diode, a current can flow from an anode to a cathode of the diode only when a voltage difference between the anode and the cathode is above a specific value, for example, about 0.7V for a typical silicon diode. Thus, a leakage current (indicated by dotted arrows shown in a lower portion of FIG. 2F) flowing through an unselected cell memory MC in an unselected cell block, e.g., BLK2, is substantially prevented by a diode, e.g., D2, coupled to unselected bit lines BL1~BL9.

When diodes are employed as the selection units SEs shown in FIGS. 2A and 2B, different operation voltages may be applied to the cell blocks BLK0~BLK2, considering voltage drops in the diodes.

FIGS. 3A to 3E are cross-sectional views illustrating a variable resistance memory device according to embodiments of the present invention.

Figure 3A:
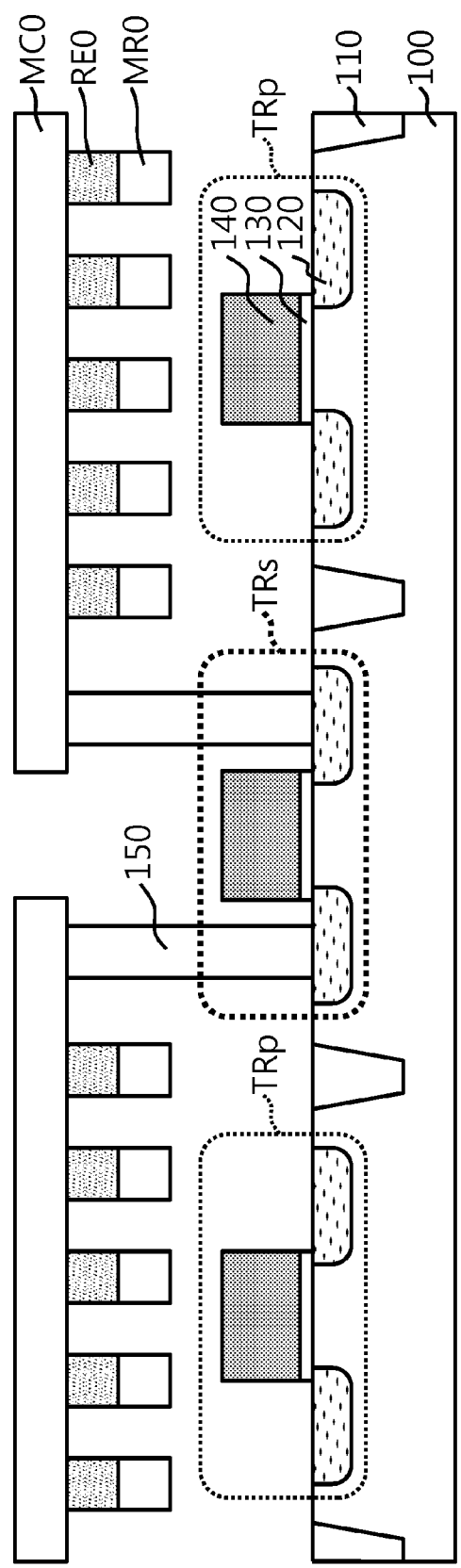
FIGS. 3A to 3E illustrate a variable resistance memory device according to embodiments of the present invention.

Referring to FIG. 3A, the variable resistance memory device includes a plurality of row lines MR extending in parallel to each other and a plurality of column lines MC extending in parallel to each other and across the row lines MR. The row line MR and the column line MC are arranged at different levels, and each may include metal, metal nitride, or doped silicon. The column lines MC may be word lines, and the row lines MR may be bit lines, or vice versa.

At intersections of the column lines MC and the row lines MR, resistance variable layers RE may be provided in a matrix pattern. An end of each of the resistance variable layers RE is coupled to one of the plurality of column lines MC, and the other end of each of the resistance variable layers RE is coupled to one of the plurality of row lines MR. An electrode (not shown) may be interposed between the column line MC and the resistance variable layer RE or between the row line MR and the resistance variable layer RE.

The resistance variable layer RE may include a structure whose electrical resistance value varies depending on a change of oxygen vacancy or ion migration, or a phase change, or a magnetic tunnel junction structure whose electrical resistance value varies depending on a magnetic field or spin transfer torque (STT).

Cell blocks, each of which includes a plurality of memory cells each including the resistance variable layer RE, may be coupled to each other through selection transistors TRs provided over a semiconductor substrate 100.

The selection transistors TRs may be formed at substantially the same level as peripheral transistors TRp. In accordance with another embodiment, some of the peripheral transistors TRp may serve as the selection transistors TRs. Each of the selection transistors TRs and the peripheral transistors TRp may include a gate electrode 140 formed in an active region of the semiconductor substrate 100, and junction regions 120 formed in the active region at both sides of the gate electrode 140. The active region may be defined by a device isolation film 110. A gate insulating layer 130 may be provided between the gate electrode 140 and the active region.

The semiconductor substrate 100 may be a single crystal silicon substrate. The device isolation film 110 and the gate insulating layer 130 may include an oxide-based material or a nitride-based material. The junction region 120 serves as a source or a drain, and may be formed by implanting dopants into the active region using an ion implantation process.

The junction region 120 of the selection transistor TRs and the column line MC may be coupled to each other through a contact plug 150. Each of the gate electrode 140 and the contact plug 150 may include a conductive material such as metal, metal nitride, or doped polysilicon.

Figure 3B:
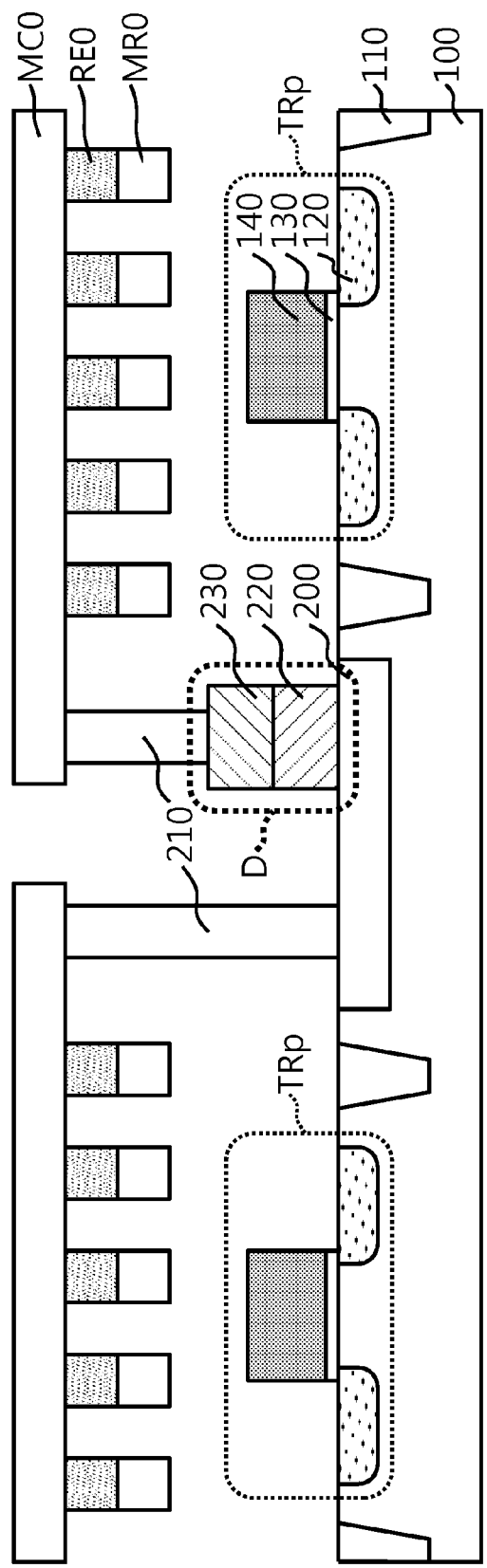
Figure 3C:
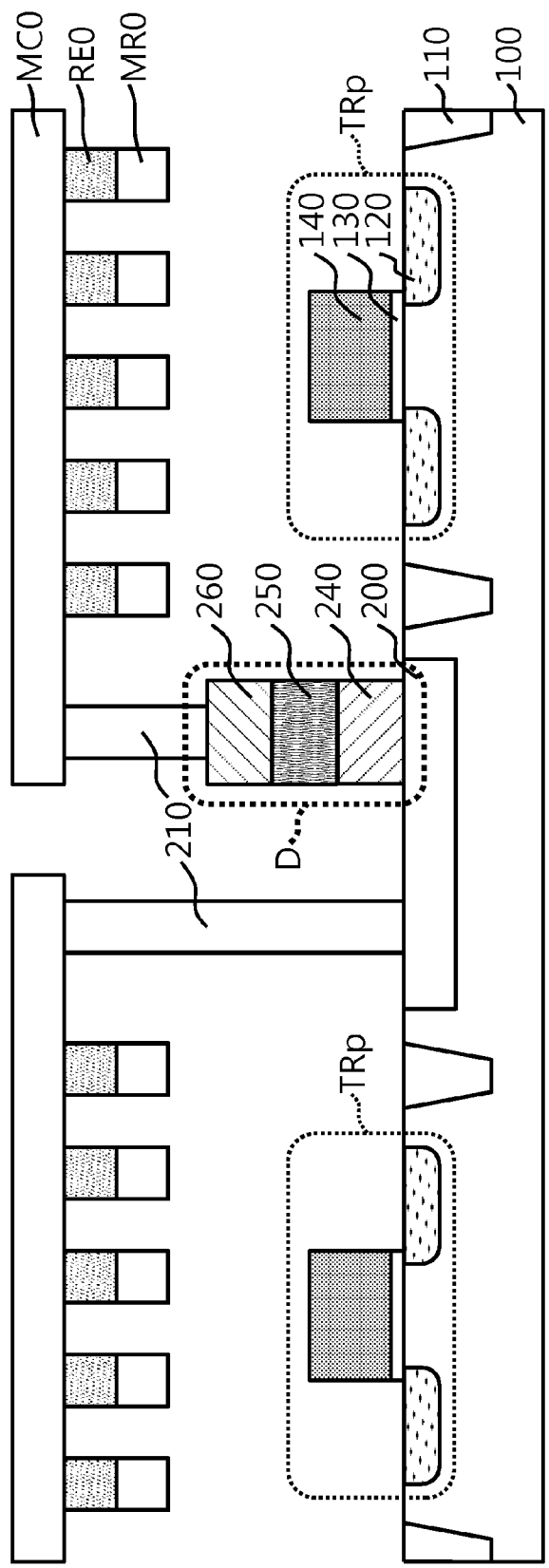

Referring to FIGS. 3B and 3C, the cell blocks, each of which includes a plurality of memory cells each including the resistance variable layer RE, may be coupled to each other through diodes D provided over the semiconductor substrate 100 including the peripheral transistors TRp.

The diode D may include a stack structure of a first material layer 220 and a second material layer 230, or a stack structure of third, fourth, and fifth material layers 240, 250, and 260. The diode D may be coupled to the column lines MC through a lower line 200 and a contact plug 210. The lower line 200 and the contact plug 210 each may include metal, metal nitride, or doped silicon.

In FIG. 3B, one of the first and the second material layers 220 and 230 may be formed of N-type semiconductor including, for example, N− polysilicon, and the other may be formed of metal, resulting in a Schottky diode. In accordance with another embodiment, one of the first and the second material layers 220 and 230 may be formed of N-type semiconductor, and the other may be formed of P-type semiconductor including, for example, P+ polysilicon, resulting in a PN diode.

In FIG. 3C, one of the third and the fifth material layers 240 and 260 may be formed of N-type semiconductor including, for example, N− polysilicon, the other may be formed of P-type semiconductor including, for example, P+ polysilicon. The fourth material layer 250 may be formed of intrinsic semiconductor to form a PIN diode. In accordance with another embodiment, the third and the fifth material layers 240 and 260 each may be formed of metal, and the fourth material layer 250 may be formed of an insulating layer, resulting in a MIM diode.

Figure 3D:
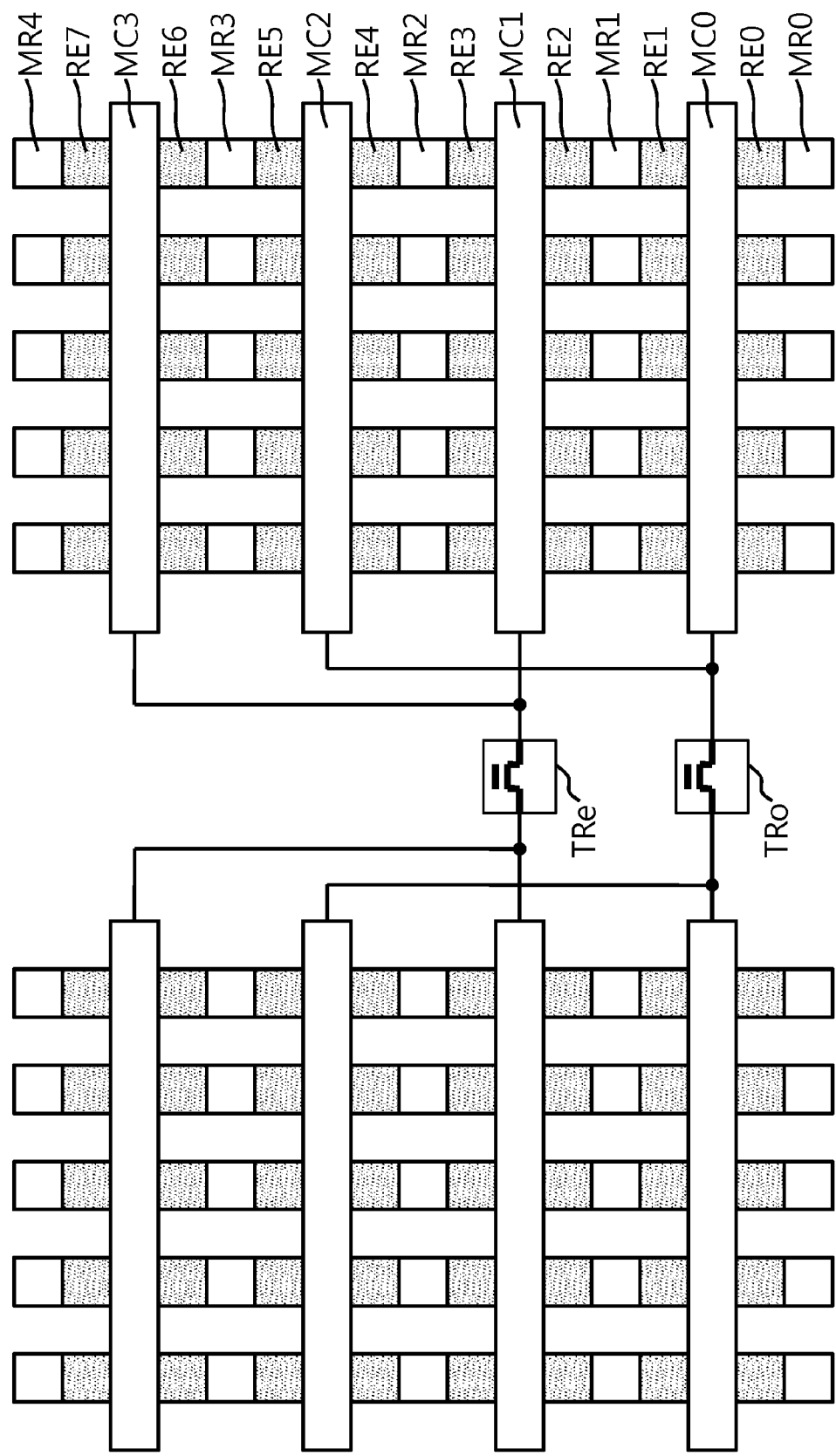
Figure 3E:
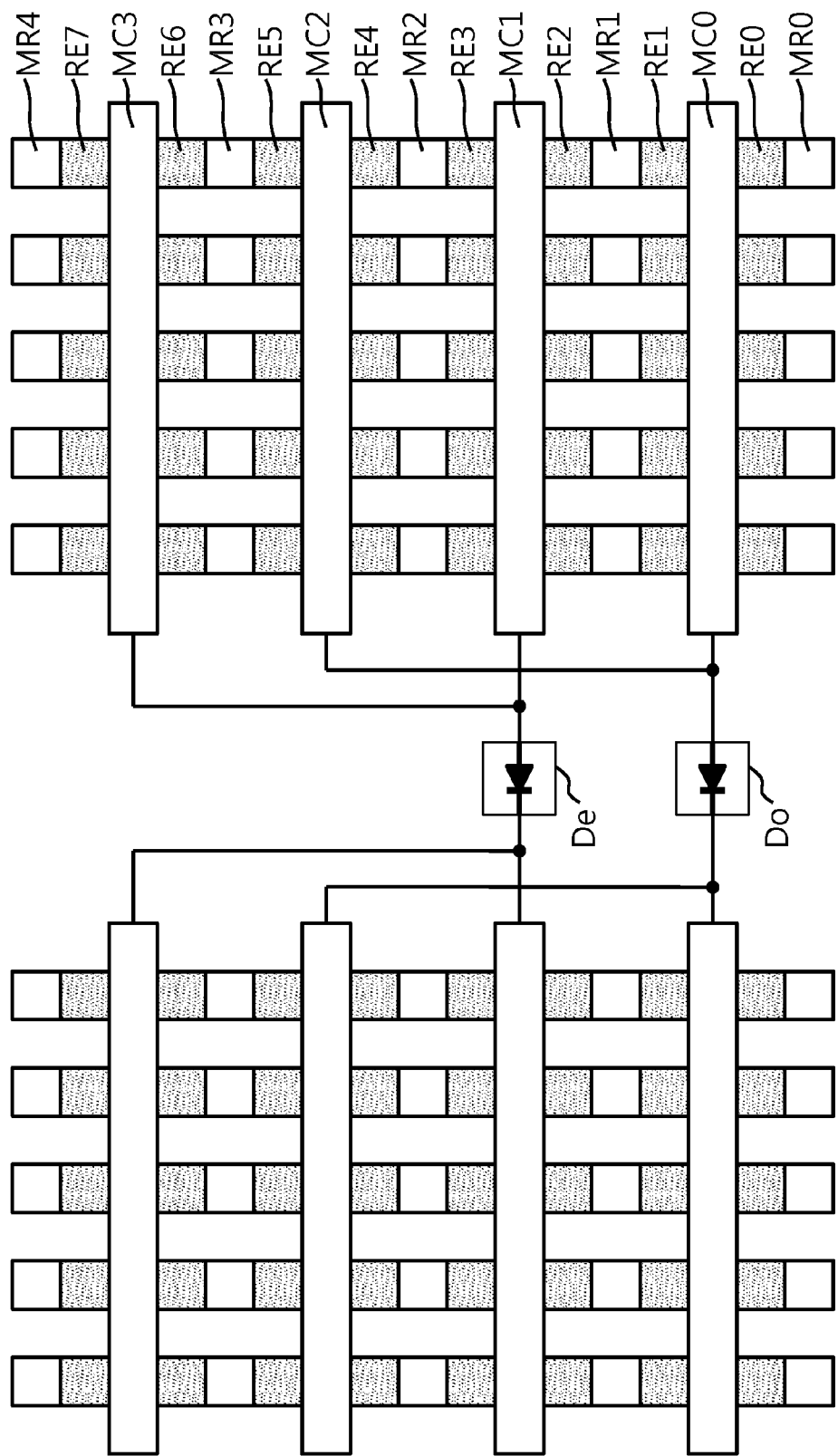

Referring to FIGS. 3D and 3E, a plurality of column lines MC0~MC3 extending in parallel to each other at different levels and a plurality of row lines MR0~MR4 extending in parallel to each other at different levels and across the plurality of column lines MC0~MC3 are stacked in an alternate manner. The variable resistance layers RE0~RE7 may be arranged at intersections of the multi-layered column lines MC0~MC3 and the multi-layered row lines MR0~MR4, and the variable resistance layers RE0~RE7 may form a plurality of cell blocks at each level.

As described above, neighboring cell blocks at the same level can be coupled to each other through a plurality of selection units coupled to a plurality of column lines extending in parallel at the same level, which correspond to one of the column lines MC0~MC3. Each selection unit may be disposed at a lower portion of each cell block, and may be formed of a transistor, a diode, an asymmetric tunnel barrier, a metal-insulator transition unit, or an Ovonic switching unit.

A leakage current flowing through unselected cells in a multi-layered memory cell array usually occurs between neighboring layers, and thus non-neighboring column lines among the column lines MC0~MC3 may share the selection units. For example, as shown in FIG. 3D, odd-numbered column lines MC1 and MC3 may share a first transistor TRe, and even-numbered column lines MC0 and MC2 may share a second transistor TRo. Likewise, as shown in FIG. 3E, the odd-numbered column lines MC1 and MC3 may share a first diode De, and the even-numbered column lines MC0 and MC2 may share a second diode Do. In other words, alternating column lines MC may share a transistor TR or diode D.

When the first and the second transistors TRe and TRo or the first and the second diodes De and Do are shared, contact plugs coupled thereto may overlap.

In such a structure, as the number of layers of the multi-layered memory cell array increases, the number of column lines coupled to one selection unit may increases accordingly, and thus additional selection units may not be necessary for additional layers of the multi-layered memory cell array.

Figure 4:
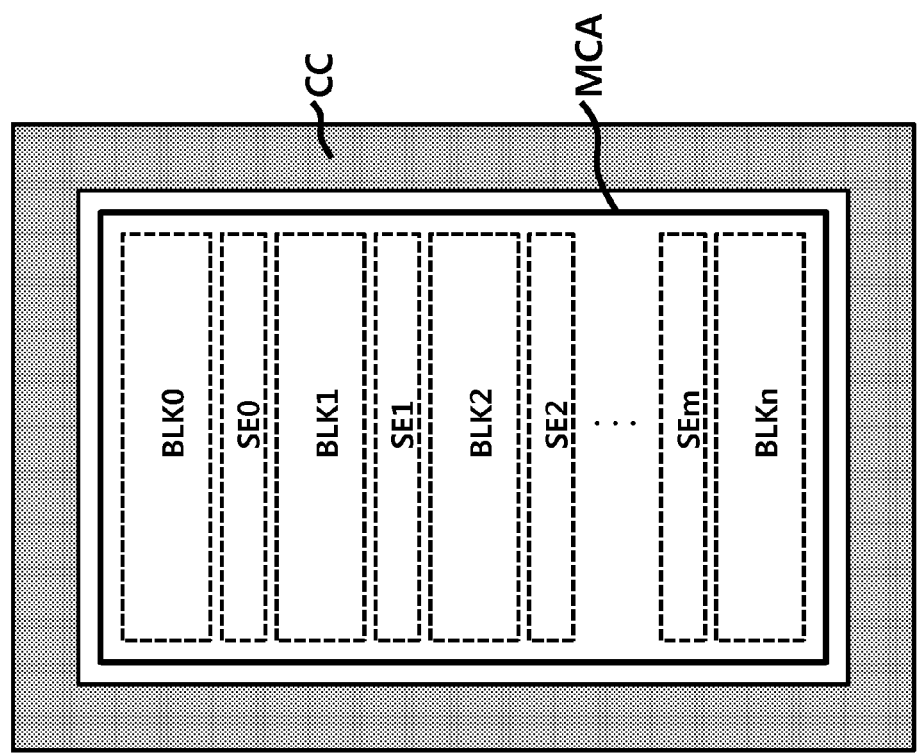
FIG. 4 illustrates a layout of a variable resistance memory device according to an embodiment of the present invention.

FIG. 4 illustrates a layout of a variable resistance memory device according to an embodiment of the present invention.

Referring to FIG. 4, a cell array MCA of the variable resistance memory device includes (i) a plurality of cell blocks BLK0~BLKn each including a plurality of variable resistance memory cells provided at intersections of a plurality of first lines and a plurality of second lines and arranged in a matrix pattern, and (ii) block selection units SE0~SEm each provided between two neighboring cell blocks of the cell blocks BLK0~BLKn, n and m being positive integers. The block selection units SE0~SEm can block currents from flowing to a selected cell block, i.e., one of BLK0~BLKn, through unselected first or second lines, and thus can reduce an area where a leakage current flows to the selected cell block.

The block selection units SE0~SEm may be located at a different level from where the cell blocks BLK0~BLKn are located. Each of the block selection units SE0~SEm may include a plurality of selection units. The plurality of selection units are respectively coupled to the first or the second lines, and are configured to couple two neighboring cell blocks of the cell blocks BLK0~BLKn.

In a peripheral region, a core circuit necessary for performing an operation of the variable resistance memory device may be provided. Especially, according to an embodiment of the present invention, a memory cell array MCA is divided into a multiple cell blocks BLK0~BLKn so that a leakage current may be controlled at a limited level not negatively affecting the operation of the variable resistance memory device even when a size of the memory cell array MCA increases. As a result, in embodiments of the present invention, a size of the memory cell array increases and a size of the core circuit decreases relative to a conventional chip.

Figure 5:
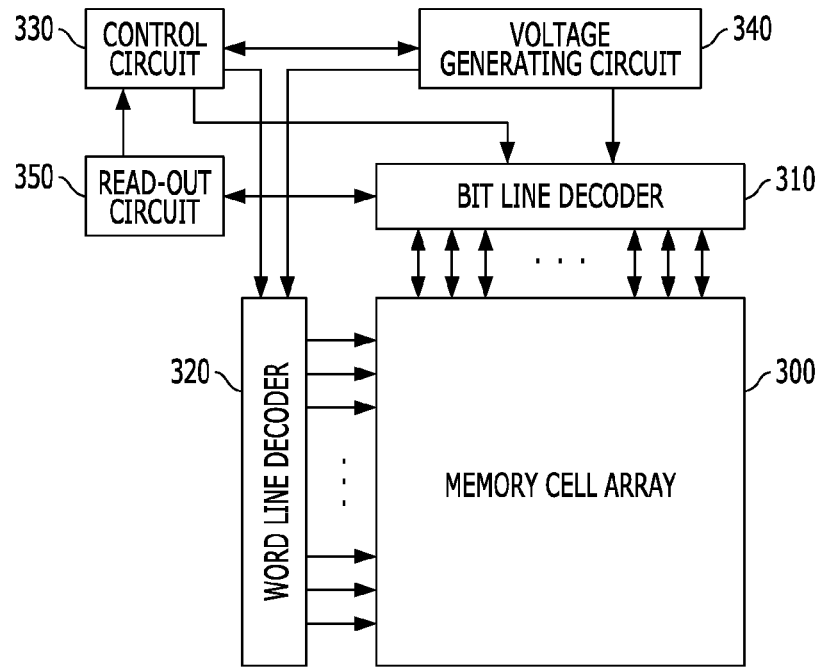
FIG. 5 illustrates a block diagram of a variable resistance memory device according to an embodiment of the present invention.

FIG. 5 illustrates a variable resistance memory device according to an embodiment of the present invention.

Referring to FIG. 5, memory cells MCs according to an embodiment of the present invention are arranged in a memory cell array 300 in a matrix pattern. A bit line decoder 310, a word line decoder 320, a control circuit 330, a voltage generating circuit 340, and a read-out circuit 350 may be provided in a peripheral region of the memory cell array 300.

The bit line decoder 310 is coupled to each bit line BL of the memory cell array 300, and selects a bit line BL in response to an address signal. Likewise, the word line decoder 320 is coupled to each word line WL of the memory cell array 300 and selects a word line WL in response to the address signal. That is, a specific memory cell MC in the memory cell array 300 may be selected by the bit line decoder 310 and the word line decoder 320.

The control circuit 330 controls the bit line decoder 310, the word line decoder 320, and the voltage generating circuit 340 in response to the address signal, a control input signal, and a data input in a writing operation, and especially controls writing, deleting, and read-out operations of the memory cell array 300. In addition, the control circuit 330 may also serve as a general address buffer circuit, a data input/output buffer circuit, or a control input buffer circuit.

The voltage generating circuit 340 generates voltages necessary for writing, deleting, and reading data from the memory cell array 300, and provides the voltages to the bit lines BL and the word lines WL.

The read-out circuit 350 detects a resistance state of a selected memory cell MC, reads out data stored in the selected memory cell MC, and transmits the read-out data to the control circuit 330.

Figure 6:
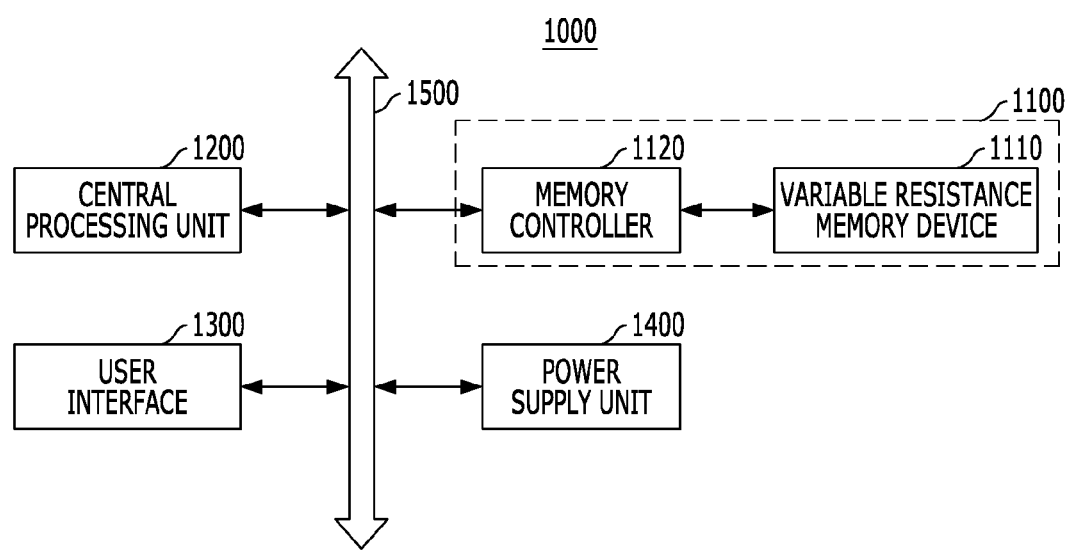
FIG. 6 illustrates a block diagram of an information processing system employing a variable resistance memory device according to an embodiment of the present invention.

FIG. 6 illustrates a block diagram of an information processing system employing a variable resistance memory device according to an embodiment of the present invention.

Referring to FIG. 6, the information processing system 1000 includes a memory system 1100, a central processing unit 1200, a user interface 1300, and a power supplying unit 1400, which can communicate with each other via a bus 1500.

The memory system 1100 may include a variable resistance memory device 1110 and a memory controller 1120. The variable resistance memory device 1110 may store data processed by the central processing unit 1200 or data transmitted from outside through the user interface 1300.

The information processing system 1000 may be employed in an electronic device for storing data, for example, a memory card, a solid state disk (SSD), a smart phone, a mobile device, etc.

As describe above, a variable resistance memory device and a method for forming the same according to embodiments of the present invention provide selection units disposed between two neighboring cell blocks in a cross point cell array to effectively prevent leakage currents. A variable resistance memory device according to an embodiment of the present invention has a simple bit line structure. When it is configured of a multi-layered structure, non-neighboring layers may share selection units so that a degree of cell integration is maximized while keeping the number of the selection units at a minimum.

Although various embodiments have been described for illustrative purposes, it will be apparent to those skilled in the art that various changes and modifications may be made without departing from the spirit and scope of the invention as defined in the following claims.

What is claimed is:

1. A variable resistance memory device, comprising:
    first lines extending in parallel to each other in a first direction;
    second lines extending in parallel to each other in a second direction crossing the first direction; and
    memory cells including variable resistance layers arranged at intersections of the first lines and the second lines,
    wherein each of the first lines is divided into a plurality of portions in the first direction, and a selection unit is provided between every two adjacent portions of the plurality of portions, is connected to both of the two adjacent portions, and serves to allow or block a current flow between the two adjacent portions,
    wherein the first lines correspond to a first group and the second lines correspond to a second group, and one or more first groups and one or more second groups are alternately stacked in a third direction that is perpendicular to the first and second directions,
    wherein the first lines included in a first one of the first groups and the first lines included in a second one of the first groups are connected to a same selection unit, and wherein the first one of the first groups and the second one of the second groups are not adjacent to each other in the third direction.

2. The variable resistance memory device of claim 1, wherein the plurality of portions include first, second, and third portions, and
    wherein a first selection unit is provided between the first and the second portions, and a second selection unit is provided between the second and the third portions.

3. The variable resistance memory device of claim 1, wherein the selection unit is provided under the first and second lines.

4. The variable resistance memory device of claim 1, wherein the selection unit is located at substantially the same level as a peripheral transistor.

5. The variable resistance memory device of claim 1, wherein the selection unit is one of a transistor, a diode, an asymmetrical tunnel barrier, a metal-insulator transition device, and an Ovonic switching device.

6. The variable resistance memory device of claim 1, wherein each of the variable resistance layers includes a structure whose electrical resistance value varies depending on a change in oxygen vacancy, ion migration, or a phase change, or a magnetic tunnel junction structure whose electrical resistance value varies depending on a magnetic field or a spin transfer torque.

7. The variable resistance memory device of claim 1, wherein the first lines are bit lines, and the second lines are word lines, or vice versa.

8. The variable resistance memory device of claim 1, wherein a first selection unit is connected to the first lines of even-numbered first groups among the one or more first groups, and
    wherein a second selection unit is connected to the first lines of odd-numbered first groups among the one or more first groups.

9. The variable resistance memory device of claim 1, wherein the selection unit is provided under the first and second groups.

10. The variable resistance memory device of claim 1, wherein the selection unit is provided at substantially the same level as a peripheral transistor.

11. The variable resistance memory device of claim 1, wherein the selection unit includes one of a transistor, a diode, an asymmetric tunnel barrier, a metalinsulator transition device, and an Ovonic switching device.

12. The variable resistance memory device of claim 1, wherein each of the variable resistance layers includes a structure whose electrical resistance value varies depending on a change in oxygen vacancy, ion migration, or a phase change, or a magnetic tunnel junction structure whose electrical resistance value varies depending on a magnetic field or a spin transfer torque.

13. The variable resistance memory device of claim 1, wherein the first lines are word lines and the second lines are bit lines, or vice versa.

* * * * *